United States Patent [19]

Ferrant

[11] Patent Number: 4,879,693

[45] Date of Patent: Nov. 7, 1989

[54] DEVICE FOR THE SELF-SYNCHRONIZATION OF THE OUTPUT CIRCUITS OF A MEMORY USING A THREE-STATE GATE

[75] Inventor: Richard Ferrant, Aix En Provence, France

[73] Assignee: SGS-Thomson Microelectronics S.A., Paris, France

[21] Appl. No.: 128,169

[22] Filed: Dec. 3, 1987

[30] Foreign Application Priority Data

Dec. 5, 1986 [FR] France ................................. 86 17041

[51] Int. Cl.$^4$ ............................................... G11C 8/00
[52] U.S. Cl. .................................. 365/233; 365/233.5; 365/189.08; 365/154; 307/473
[58] Field of Search ....................... 365/189, 200, 233; 307/473

[56] References Cited

U.S. PATENT DOCUMENTS

| 4,707,810 | 11/1987 | Ferrant | 365/200 X |
| 4,744,063 | 5/1988 | Ohtani et al. | 365/233 X |
| 4,761,767 | 8/1988 | Ferrant | 365/200 X |
| 4,771,405 | 9/1988 | Burch et al. | 365/189 X |
| 4,777,623 | 10/1988 | Shimazu | 365/189 |

FOREIGN PATENT DOCUMENTS 0144223  6/1985  European Pat. Off. .
0180001  5/1986  European Pat. Off. .

OTHER PUBLICATIONS

IEEE Journal of Solid–State Circuits, vol. Sc–20, No. 5, Oct. 1985, pp. 941–950, IEEE, N.Y., U.S.; L. C. Sood et al.: "A fast 8K X 8 CMOS SCRAM with international power down design techniques"*Page 944, solonne de gauche, ligne 14—p. 945, colonne dedroite, ligne 8; FIGS. 6-12*

Primary Examiner—Stuart N. Hecker
Assistant Examiner—Alfonso Garcia
Attorney, Agent, or Firm—Oblon, Spivak, McClelland, Maier & Neustadt

[57] ABSTRACT

A self-synchronization device is disclosed for output circuits comprising a "3-state" gate of memories working in internal clock mode. This device consists of a sequential logic circuit which allows the "3-state" gate to go into low impedance only when a datum is available at the output of the read amplifiers.

9 Claims, 4 Drawing Sheets

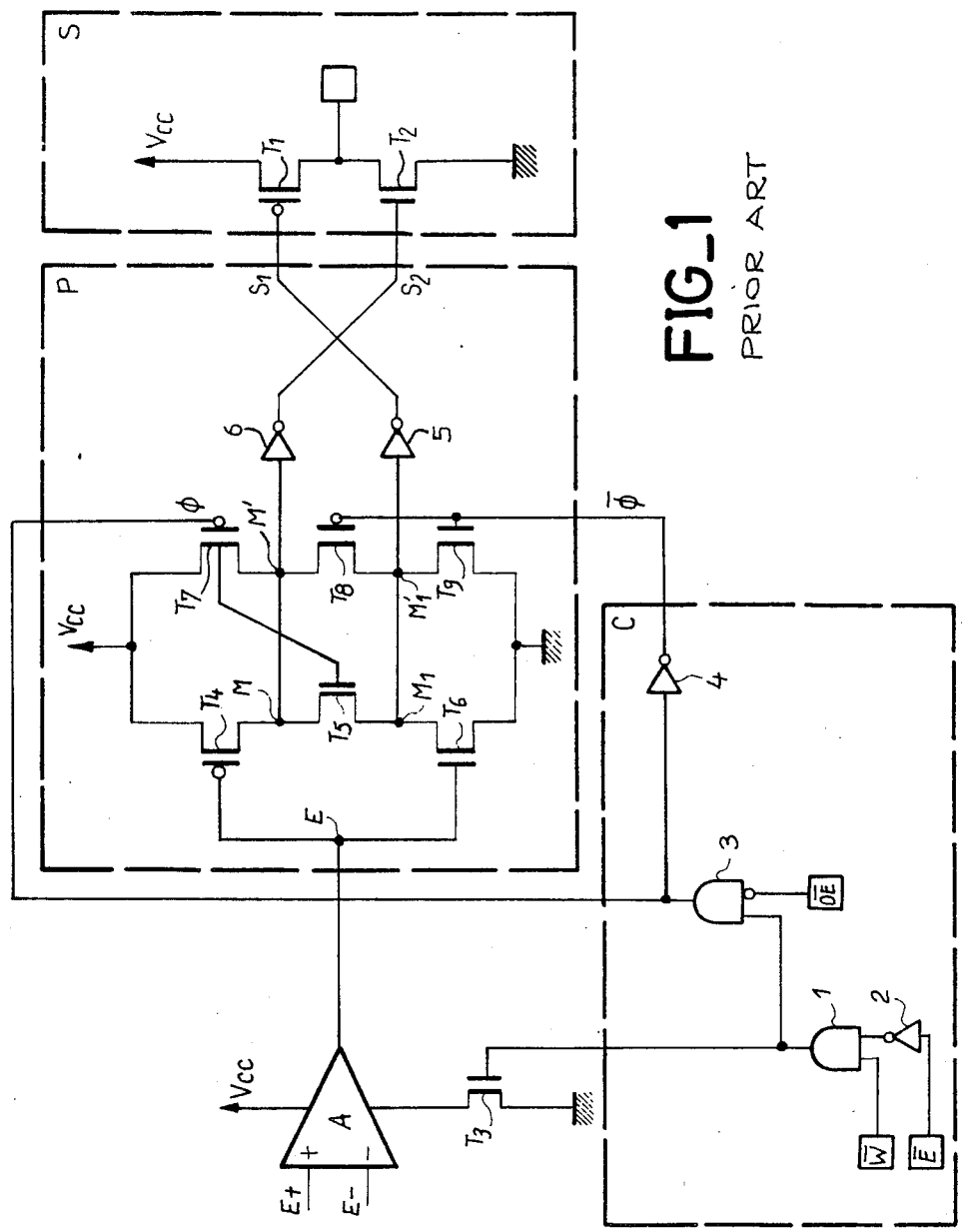
FIG_1 PRIOR ART

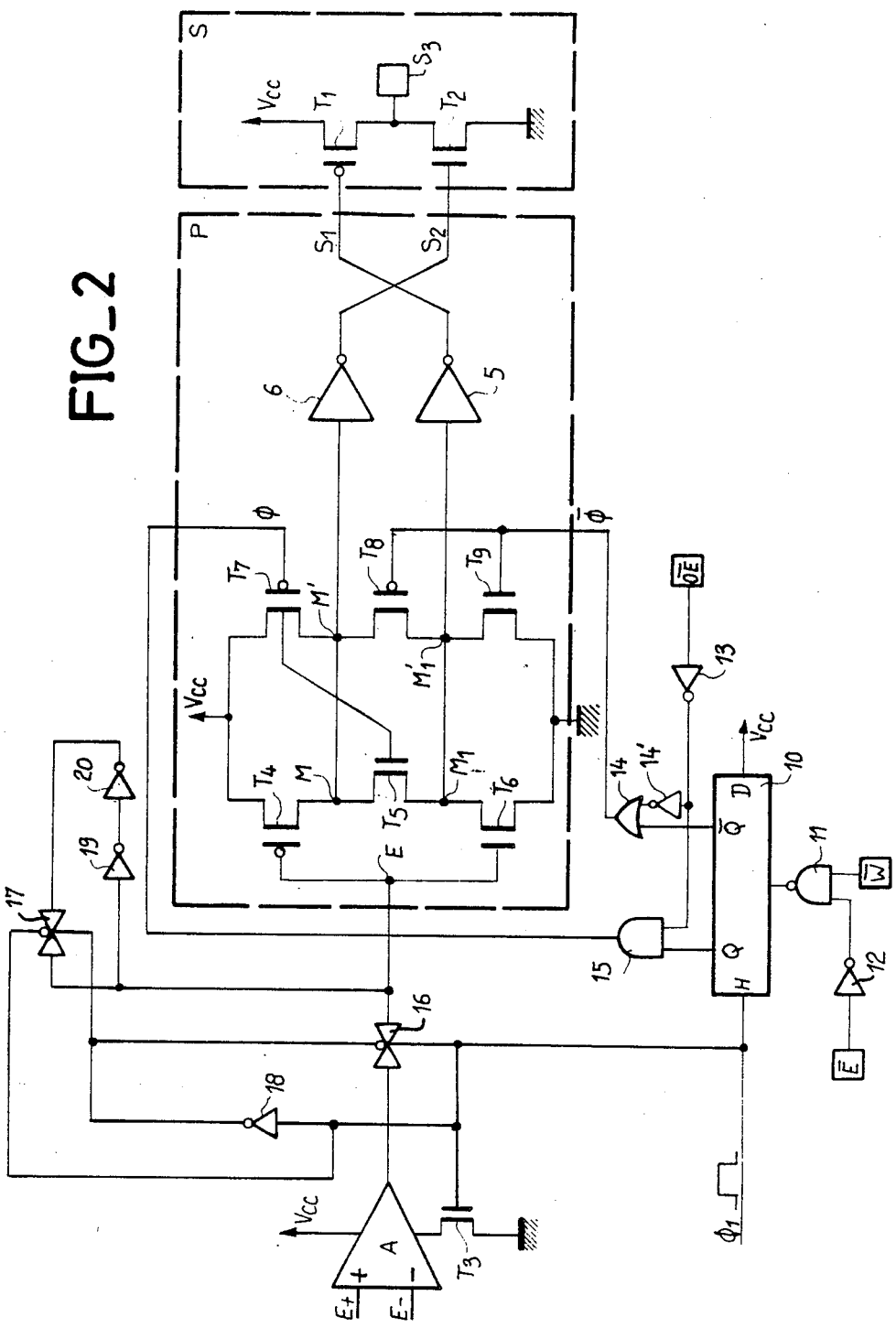
FIG_2

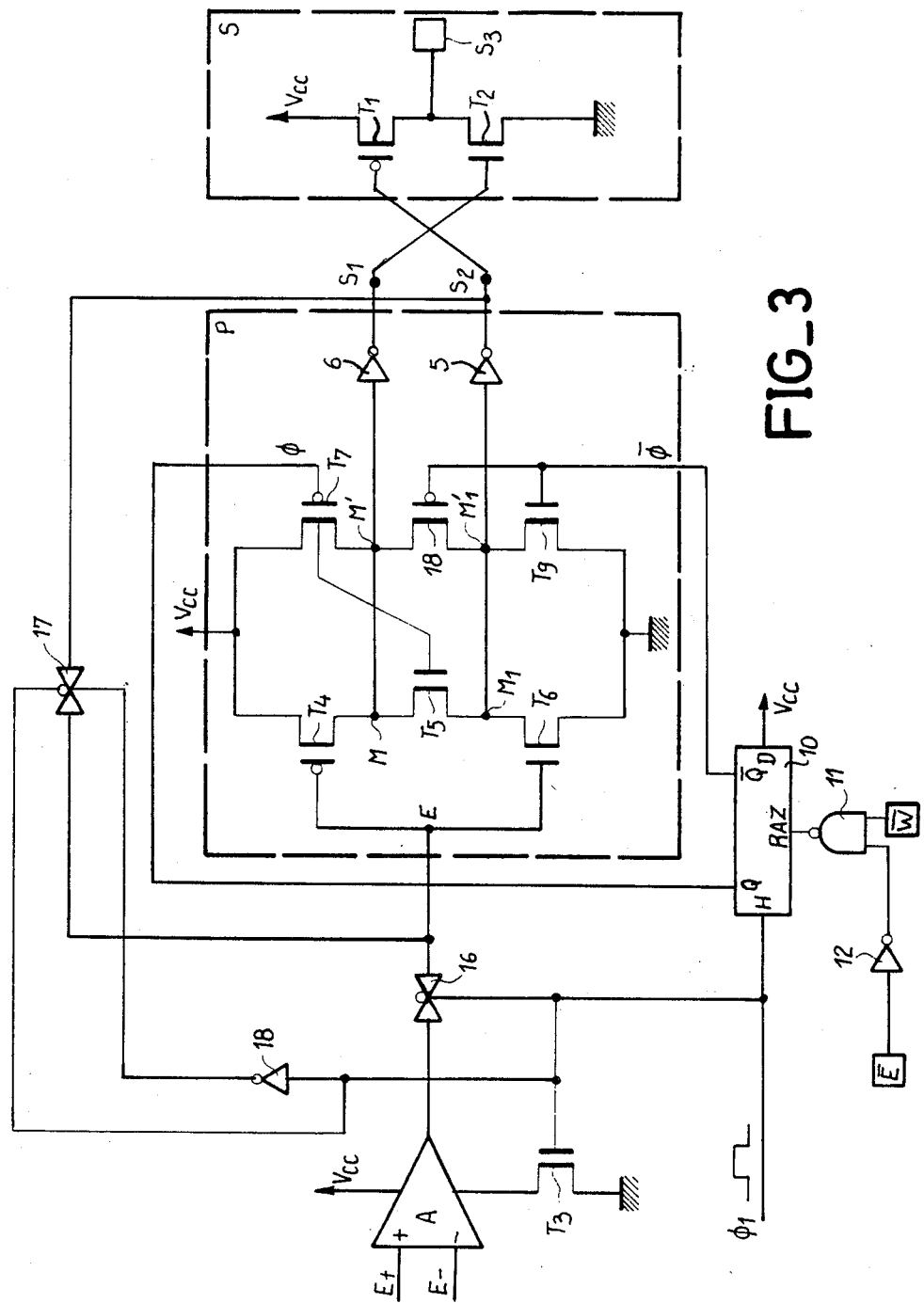
FIG_3

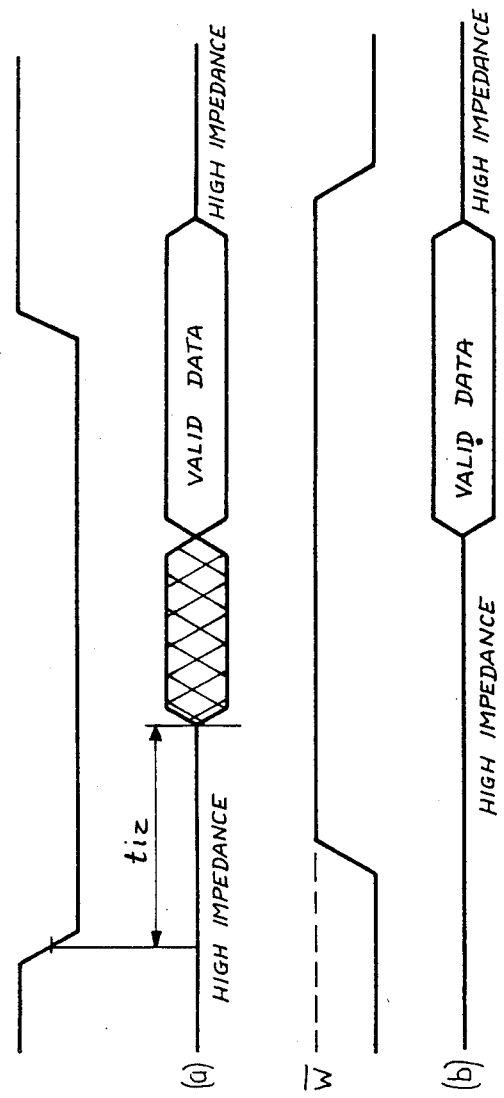
FIG_4

DEVICE FOR THE SELF-SYNCHRONIZATION OF THE OUTPUT CIRCUITS OF A MEMORY USING A THREE-STATE GATE

BACKGROUND OF THE INVENTION

1. Field of the Invention

The present invention pertains to a device for the self-synchronization of the output circuits of a memory. It pertains more especially to a device for the self-synchronization of the output circuits of a memory comprising a so-called "3-state" gate enabling a high-impedance state.

2. Description of the Prior Art

Most memories used today, i.e. both ROMs (read-only memories) and RAMs (random-access memories), use output circuits that have a high impedance state, i.e. they are capable of adopting an indeterminate level corresponding to an output disconnected from the circuit. This high impedance state enables the parallel connection of the outputs of several circuits, only one of which is put into operation at a time. Generally, this high impedance state is monitored by using a combinational logic circuit, the propagation characteristics of which are unrelated to the characteristics of the output logic. This combinational logic circuit generally comprises logic gates controlled by signals such as the output control signals $\overline{E}$, $\overline{W}$, $\overline{EO}$. As a result of using this type of circuit, the change from high impedance to low impedance occurs very early in the read and write cycle. This leads to a number of unwanted commutations in the output stages. For, at that moment, the read amplifiers are incapable of giving useful information.

These unwanted commutations have the following disadvantages:

Unnecessary congestion of the output bus which may penalize the system in which the memory is integrated, Current surges internal to the circuit, resulting from the commutations of the output stages formed by power transistors having a width of several hundreds of microns. These current surges generate a particularly troublesome noise for the circuit which is then in a stage of amplification of small signals. Consequently, the efficiency of the system may be greatly reduced.

SUMMARY OF THE INVENTION

It is an object of the present invention to remove these disadvantages by proposing a new circuit to monitor the high impedance state, usable in the output circuits of memories working in the internal clock mode.

Thus, an object of the present invention is a self-synchronization device for output circuits comprising a "3-state" gate of memories working in the internal clock mode, the said device comprising a sequential logic circuit which allows the "3-state" gate to go into low impedance only at the instant when a datum is available at the output of the read amplifiers.

According to a preferred embodiment of the invention, the sequential logic circuit comprises a D type latch flip-flop controlled by a pulsating clock signal, the outputs of which control the "3-state" gate, and by a storage loop.

Furthermore, the D type flip-flop is reset by means of a combinational logic circuit controlled by the signals $\overline{E}$ and $\overline{W}$. At least during the read mode, the output D of the D type flip-flop is positioned at the logic level 1. For example, the output D may be supplied by the supply voltage Vcc. When the memory comprises the control signal $\overline{OE}$, the output signals of the D type flip-flop are combined with the signal $\overline{OE}$ before being sent to the "3-state" gate.

According to another characteristic of the present invention, when the memory comprises the control signal $\overline{OE}$, the storage loop is made using one of the inverting circuits of the "3-state" gate.

According to an additional characteristic of the invention, the read amplifier is controlled by the same clock signal as the D type flip-flop.

Furthermore, the pulsating clock signal comprises pulses with a duration which is at least equal to the response time of the read amplifier.

BRIEF DESCRIPTION OF THE DRAWINGS

Other characteristics and advantages of the present invention will emerge from the following description of various embodiments made with reference to the appended drawings, of which:

FIG. 1 shows a prior art output circuit of a memory,

FIG. 2 shows an output circuit of a memory provided with a self-synchronization device according to the present invention, FIG. 3 represents another embodiment of an output circuit of a memory provided with a self-synchronization device according to the present invention, FIG. 4 is a timing diagram of a write cycle showing the advantages of the present invention.

To simplify the descriptions, the same references are repeated for the same elements in all the figures.

DESCRIPTION OF THE PREFERRED EMBODIMENTS

The present invention will be described without referring to any specific type of memory. For it applies both to ROMs and RAMs. It is necessary only that the memory used is of the internal clock type as will be explained below.

FIG. 1 shows an output circuit of a memory according to the prior art. This circuit essentially comprises a read amplifier A, a "3-state" gate P, an output stage S and a circuit C to monitor the change-over to high impedance. The read amplifier A comprises a differential amplifier which receives the signals E+ and E− coming from the bit lines corresponding to a row of memory cells. The output of the differential amplifier is controlled by a signal coming from the circuit C. In fact, the signal from the circuit C is applied to the gate of an N-channel MOS transistor T3 which has one of its electrodes, namely the source in the technology usually employed, connected to the ground and its other electrode or drain connected to the control input of the differential amplifier. The output of the differential amplifier is connected to the input of the "3-state" gate.

In the embodiment shown, the "3-state" gate consists of two sets of MOS transistors parallel-mounted between the supply voltage and the ground. The first set of MOS transistors comprises a P-channel MOS transistor T4, series-mounted with an N-channel MOS transistor T5, which is itself series-mounted with an N-channel MOS transistor T6, the source of the transistor T4 being connected to the supply voltage Vcc and the source of the transistor T6 being connected to ground. Furthermore, the drain of the transistor T4 is connected to the drain of the transistor T5 which has its source connected to the drain of the transistor T6. The gates of the transistors T4 and T6 are connected together and are connected to the node E representing the input of the "3-state" gate. The second set comprises a P-channel MOS transistor T7, which is series-mounted with a P-channel transistor T8. The said transistor T8 is itself series-mounted with an N-channel transistor T9. The source of the transistor T7 is connected to the voltage Vcc and the source of the transistor T9 is connected to ground. Furthermore, the drain of the transistor T7 is connected to the source of the transistor T8 which has its drain connected to the drain of the transistor T9. The gates of the transistors T8 and T9 are connected together and receive the control signal $\overline{\phi}$ while the gate of the transistor T7 receives the control signal $\phi$. Furthermore, the gate of the transistor T5 is connected to the gate of the transistor T7. The nodes M and M', which are between the transistors T4 and T5, and the transistors T7 and T8 respectively, are connected together to the input of an inverter 6, the output S2 of which is one of the outputs of the "3-state" gate. Similarly, the nodes M1 and M1', which are between the transistors T5 and T6 and between the transistors T8 and T9 respectively, are connected together and to the input of an inverter 5, the output S1 of which is the other output of the "3-state" gate.

The outputs S1 and S2 of the "3-state" gate are respectively connected to the inputs of the output stage S. This stage consists of two cascade-mounted power MOS transistors. More specifically, this stage comprises a P-channel MOS transistor T1 which has its source connected to the voltage Vcc and its drain connected to the drain of an N-channel MOS transistor T2, the source of the said transistor T2 being connected to ground. The gates of the transistors T1 and T2 are connected to the outputs S1 and S2 of the "3-state" gate. The output signal of the circuit is obtained at the terminal S3.

Furthermore, the signals $\phi$ and $\overline{\phi}$ monitoring the high-impedance state are obtained from the circuit C. In the embodiment shown, this circuit is a combinational logic circuit. Here, this circuit C consists essentially of an AND gate 1 which receeies the write command signal $\overline{W}$ at one of its inputs and the output signal of an inverter 2 at its other input, the said inverter 2 receiving in input the control signal $\overline{E}$. For memories which do not comprise any $\overline{W}$ signal, such as ROMs, the said $\overline{W}$ signal may be replaced by a logic level 1. Furthermore, if the memory comprises the signal $\overline{OE}$, the said signal is sent after inversion to one input of an AND gate 3, the other input of which receives the output of the AND gate 1. If the memory does not have the signal $\overline{OE}$, the AND gate 3 is eliminated. The output of the AND gate 3 gives the control signal $\phi$ and, after reversal in the inverter 4, it gives the control signal $\overline{\phi}$. Furthermore, the output signal of the AND gate 1 is sent to the gate of the MOS transistor T3 which controls the output of the differential amplifier.

The operation of the "3-state" gate is such that, when the control signal $\phi$ is at the logic level 1, the gate is in the low impedance state and the outputs S1 and S2 are at logic levels which depend on the logic level present at E. However, when the control signal $\phi$ is at the logic level 0, the gate is in the high impedance state. In fact, the gate is in the low impedance state when the signals $\overline{E}$ and $\overline{OE}$ are at the logic level 0 and the signal $\overline{W}$ is at the logic level 1. Thus, since the propagation characteristics of the circuit C are not related to the read logic characteristics, the result is that the passage from high impedance to low impedance occurs very early in the read cycle as shown in the diagram (a) of FIG. 4, and this results in a number of unwanted commutations of the output stages. These commutations are symbolized by the hatched part of the diagram.

To remove this disadvantage, the combinational logic circuit C has been changed into a sequential logic circuit as shown in the FIGS. 2 and 3. In these figures, the circuits A, P and S are identical to those shown in FIG. 1. They shall therefore not be described again.

As shown in FIGS. 2 and 3, the sequential logic circuit consists of a D type latch flip-flop 10 comprising a clock control. The input D of the flip-flop is positioned at the logic level 1, at least during the read mode. In the embodiment shown, it is connected to the voltage Vcc. The input H of the flip-flop receives the pulsating signal $\phi 1$ which consists of one of the clock signals of the memory. This signal $\phi 1$ is also applied to the gate of the MOS transistor T3 controlling the differential amplifier A. Furthermore, the reset input RAZ of the flip-flop receives a signal which is a combination of the control signals $\overline{E}$ and $\overline{W}$. Specifically, the control signal $\overline{E}$ is sent through an inverter 12 to one of the inputs of a NAND gate 11, the other input of which receives the control signal $\overline{W}$. In the embodiment of FIG. 2, the outputs Q and $\overline{Q}$ are respectively connected to one of the inputs of an AND gate 15 and of an OR gate 14. The other input of the AND gate 15 receives the output signal of an inverter 13, the input of which receives the control signal $\overline{OE}$, while the other input of the OR gate 14 receives the signal from an inverter 14' connected to the output of the inverter 13. The output of the AND gate 15 is connected to the input $\phi$ of the "3-state" gate while the output of the OR gate 14 is connected to the input $\overline{\phi}$ of the "3-state" gate. In the example of FIG. 3, the outputs Q and $\overline{Q}$ are directly connected to the inputs $\phi$ and $\overline{\phi}$ respectively of the "3-state" gate.

Since the read amplifier is controlled by a pulsating signal, the data must be memorized in the stages that follow. Two storage or memorizing loops have been shown in FIGS. 2 and 3 respectively, depending on the presence or absence of the control signal $\overline{OE}$.

The storage loop of FIG. 2 comprises a transfer gate 16 which has its input connected to the output of the read amplifier A and its output connected to the input of the "3-state" gate. The said storage loop of FIG. 2 further has a transfer gate 17 which has its input connected to the output of the transfer gate 16 through two inverters 19 and 20 and its output connected to the input of the "3-state" gate. The transfer gate 16 is controlled at the direct command input by $\phi 1$ and at the inverted command input by $\phi 1$, obtained by sending the signal $\overline{\phi 1}$ to an inverter 18. Furthermore, the transfer gate 17 is controlled at the direct command input by $\overline{\phi 1}$ and at the inverted command input by $\phi 1$.

The storage loop of FIG. 3 is substantially identical to that of FIG. 2. The difference lies in the fact that the input of the transfer gate 17 is directly connected to the output S2 of the "3-state" gate.

The functioning of the circuit according to the present invention will be explained with the help of the following truth table of a D type latch flip-flop with clock input.

| | D type latch flip-flop with clock input | | | | |
|---|---|---|---|---|---|
| RAZ | H | D | Q | $\overline{Q}$ | OUTPUT |
| 1 | X | X | 0 | 1 | HI |

-continued

| D type latch flip-flop with clock input | | | | | |
|---|---|---|---|---|---|
| RAZ | H | D | Q | Q̄ | OUTPUT |
| 0 | ↑ | 0 | 0 | 1 | HI |
| 0 | ↑ | 1 | 1 | 0 | LI |
| 0 | ↓ | X | Q | Q̄ | Not modified |

In the above table, X means that the logic level may be either impedance , while HI and LI respectively mean high impedance and low impedance.

Thus, when the reset input RAZ is at the logic level 1, i.e. if the read mode is not activated, whatever the logic level of the clock and of the input D, the output of the "3-state" gate will be in high impedance because Q is at the logic level 0. In the read mode, the output of the "3-state" gate will go into low impedance on the rising edge of the clock signal, for the input D is at the logic level 1. The descending edge of the clock signal does not modify the state of the output of the "3-state" gate which stays in low impedance. This output returns to high impedance when the reset signal RAZ returns to the logic level 1, i.e. at the end of the read cycle.

Furthermore, the read amplifier is no longer controlled by a static signal as in the prior art, but by the clock signal $\phi 1$ which appears only at the end of the initalizing stage of the read cycle. The clock signal $\phi 1$ is a pulsating signal with a duration that is at least equal to the response time of the read amplifier.

Consequently, if the D type flip-flop has an inherent time lag equal to that of the amplifier, the change-over from high impedance to low impedance will take place at the precise moment when the amplifier delivers a valid datum. This makes it possible to eliminate all unnecessary transitions at the output stages and the bus.

Furthermore, the pulsating control of the amplifier requires the memorizing of the data in the following stages of the output circuit. This explains the presence of the storage loops shown in FIGS. 2 and 3.

This pulsating command can be used to check decoding. In this case, the decoders and the read amplifiers are active only together. This makes it possible to reduce the consumption of the amplifiers to the level strictly necessary for obtaining a datum.

The device according to the present invention has the following advantages:

It leaves the outputs of the output circuit in high impedance throughout almost the entire first read after write cycle or "standby cycle" as shown in FIG. 4, diagram (b) where it is seen that the output is in high impedance for 90% of the cycle as compared with 20% in prior art circuits;

It preserves the data of the preceding cycle in the same proportions as during access operations monitored by the addresses;

It eliminates the greater part of the internal commutations of the output transistors and, therefore, enables the detection circuits to work in an environment with less noise.

As shown in FIG. 4, which refers to a read cycle with the signal $\overline{CS}$ at the low level and the signal W at the high level, the change-over to low impedance occurs at the precise moment when the valid data are present and the hatched part of the diagram (a) is eliminated.

Furthermore, in the case of standard RAMs such as SRAMs and DRAMs, the initial resetting of the D type flip-flop is done automatically. For, after it is made alive, a RAM is written before it is read, and this puts the outputs in high impedance. For the other types of memories, a reset signal can be provided when the RAM is made alive.

What is claimed is:

1. A self-synchronization device for output circuits of memories working in an internal clock mode, comprising a "3-state" gate connected to the output of read amplifiers, the working of said memories being monitored by read and operation control signals $\overline{W}$ and $\overline{E}$, said device comprising a sequential logic circuit which allows the "3-state" gate to go into low impedance only at the instant when a datum is available at the output of the read amplifiers.

2. Device according to the claim 1 wherein the sequential logic circuit consists of a D type latch flip-flop controlled by a pulsating clock signal, a reset signal and a signal at the terminal D, the said D type flip-flop emitting output Q and $\overline{Q}$ signals which control the "3-state" gate, the said sequential logic further comprising a storage loop.

3. Device according to the claim 2 wherein the read amplifier is controlled by the same pulsating clock signal as the D type flip-flop.

4. Device according to the claim 2 wherein the pulsating clock signal consists of pulses, the duration of which is at least equal to the response time of the read amplifier.

5. Device according to the claim 2 wherein the signal at the terminal D of the D type flip-flop is positioned at the logic level "1" at least during the read mode.

6. Device according to the claim 2 wherein the reset signal of the D type flip-flop comes from a combinational logic circuit controlled by the signals $\overline{E}$ and $\overline{W}$.

7. Device according to the claim 6 wherein the combinational logic circuit comprises a NAND gate with one of its gates receiving the signal $\overline{W}$ and the other gate receiving the output of an inverter, the input of which receives the signal $\overline{E}$.

8. Device according to the claim 2 wherein, when the memory comprises the control signal $\overline{OE}$, the signals Q and $\overline{Q}$ of the D type flip-flop are sent respectively to an AND gate and to an OR gate before being sent to the "3-state" gate, the AND gate receiving the inverted signal $\overline{OE}$ at its other input and the OR gate receiving the signal $\overline{OE}$ at its other input.

9. Device according to the claim 2 wherein the storage loop consists of two transfer gates controlled by the clock signal 1.

* * * * *